US006963192B2

United States Patent
Schultz

(12) United States Patent
(10) Patent No.: US 6,963,192 B2
(45) Date of Patent: Nov. 8, 2005

(54) DEVICE FOR TRACING ELECTRICAL CABLE

(76) Inventor: James A. Schultz, 165 Town Hill Rd., Warren, CT (US) 06754

( * ) Notice: Subject to any disclaimer, the term of this patent is extended or adjusted under 35 U.S.C. 154(b) by 0 days.

(21) Appl. No.: 10/277,085

(22) Filed: Oct. 22, 2002

(65) Prior Publication Data

US 2003/0086537 A1 May 8, 2003

Related U.S. Application Data

(60) Provisional application No. 60/330,460, filed on Oct. 22, 2001.

(51) Int. Cl.[7] .............................................. G01R 19/00
(52) U.S. Cl. ...................... 324/66; 324/542; 379/22.02; 379/25
(58) Field of Search .......................... 324/66, 539, 542; 379/22.02, 25, 27.01

(56) References Cited

U.S. PATENT DOCUMENTS

| 3,903,380 | A | * | 9/1975 | Schomburg | ................... 324/66 |
| 6,233,558 | B1 | * | 5/2001 | Whalley | ..................... 704/270 |
| 2004/0000898 | A1 | * | 1/2004 | Pool et al. | ..................... 324/66 |

* cited by examiner

Primary Examiner—N. Le
Assistant Examiner—Timothy J. Dole

(57) ABSTRACT

A device for tracing electrical cable. The device allows a cable installer or service person not only to identify one wire or cable in a group, but to simultaneously remotely identify as many cables as he desires. The device requires only that the installer connect a test device to each of the cables which he wishes to identify. Additionally, this identification is extremely easy to accomplish, as the "Identifying label" is in the installers own spoken words, and can be heard at the remote end by using existing industry standard test equipment (i.e.: an installer's test set, phone, headset, or amplified probe).

10 Claims, 2 Drawing Sheets

DEVICE FOR TRACING ELECTRICAL CABLE

CROSS-REFERENCE TO RELATED APPLICATIONS

This application claims priority to U.S. Provisional Application Ser. No. 60/330,460, filed on Oct. 22, 2001, entitled, "Device for Tracing Electrical Cable" the entire contents of which are incorporated herein by reference.

BACKGROUND OF THE INVENTION

The present invention generally relates to the field of communications and more particularly, is directed to a device for tracing communications lines, such as telephone, computer and CATV cabling.

A number of cable tracing devices are currently known in the prior art. These devices range from a simple continuity tester to more sophisticated electronic meters. For relatively short runs, devices of the prior art can be used with relative ease for tracing and identifying wires and cables. For long runs, however, prior art devices become inefficient and often requires the user to traverse great distances from one cable end to the other in order to identify the cable of interest. When using a continuity tester, for example, the user must first inject a test signal at one end of the cable and travel to its expected end to test for presence of the signal. Doing so is time consuming and is not an efficient use of time.

Thus, there is a need in the art for a device for tracing electrical cable which can be efficiently used to trace cables who's ends are in remote locations.

SUMMARY OF THE INVENTION

Accordingly, it is an object of the present invention to obviate the above noted shortcomings and disadvantages of cable tracing devices known in the art.

It is a specific objective of the present invention to provide a device for tracing electrical cables which is easy to use and economical to make.

It is another specific objective of the present invention to provide a device for tracing electrical cables which allows a single user to efficiently trace, locate and distinguish a plurality of cables remotely.

These and other objects of the present invention are achieved by a device which allows a cable installer or service person not only to identify one wire or cable in a group, but to simultaneously remotely identify as many cables as he desires. The invention requires only that the installer connect a test device to each of the cables which he wishes to identify. Additionally, this identification is extremely easy to accomplish, as the "Identifying label" is in the installers own spoken words, and can be heard at the remote end by using existing industry standard test equipment (i.e.: an installer's test set, phone, headset, or amplified probe).

BRIEF DESCRIPTION OF DRAWINGS

The novel features of the present invention are set out with particularity in the appended claims, but the invention will be understood more fully and clearly from the following detailed description of the invention as set forth in the accompanying drawings in which:

DESCRIPTION OF THE PREFERRED EMBODIMENT

Figure 1:
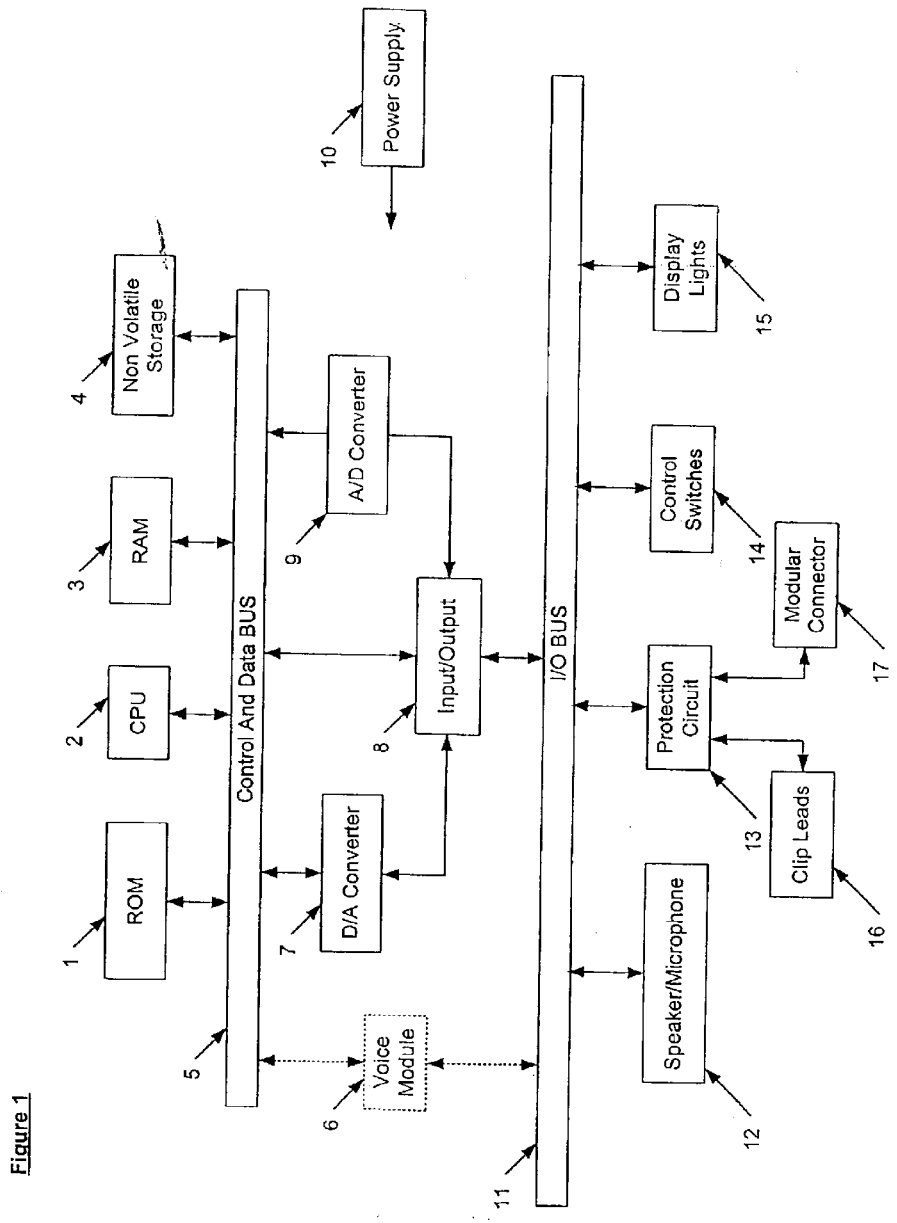
FIG. 1 is block diagram of a device for tracing electrical cables in accordance with the present invention.

FIG. 1 is a block diagram of one embodiment of a cable tracing device in accordance with the present invention. The device includes a number of interconnected elements connected together by a Control And Data BUS 5 and an I/O Bus 11. A Central Processing Unit (CPU) 2 controls the operation and function of each of the elements. CPU 2 is coupled to read only Memory (ROM) 2, Random Access Memory (RAM) 3 and Non-Volatile Storage 4. These memory elements store data and computer control routines which are executed by CPU 2 in order to carry out its control functions.

CPU 2 also is coupled to voice Module 6 for recording and playing back a voice, D/A Converter 7 for performing digital to analog conversion from Input/Output 8 and A/D Converter 9 for performing analog to digital conversion also from Input/Output 8.

A Speaker/Microphone 12 is provided for oral interface with the cable installer. Protection Circuit 13 allows the tracing device of the invention to be safely connected to the cable or wire being tested via Clip Leads 16 and/or Modular Connector 17. The tracing device of the invention also includes Control Switches 14 and Display Lights 15 for manually controlling the operation of the device and providing a visual indication of its status to the user.

The device is powered by a power supply 10 which can be a small battery.

The device of the invention is operated by the installer recording a room location in the device via Speaker/Microphone 12. The device is then attached to the remote end of the cable which automatically puts it in to "transmit" mode. In the transmit mode, the device feeds an audio signal into the cable which is in essence the recorded room location where the cable terminates. The installer can then trace this signal all the way back to the cable entrance point to the building or any place in between using, for example, a standard installer test set.

Figure 2:
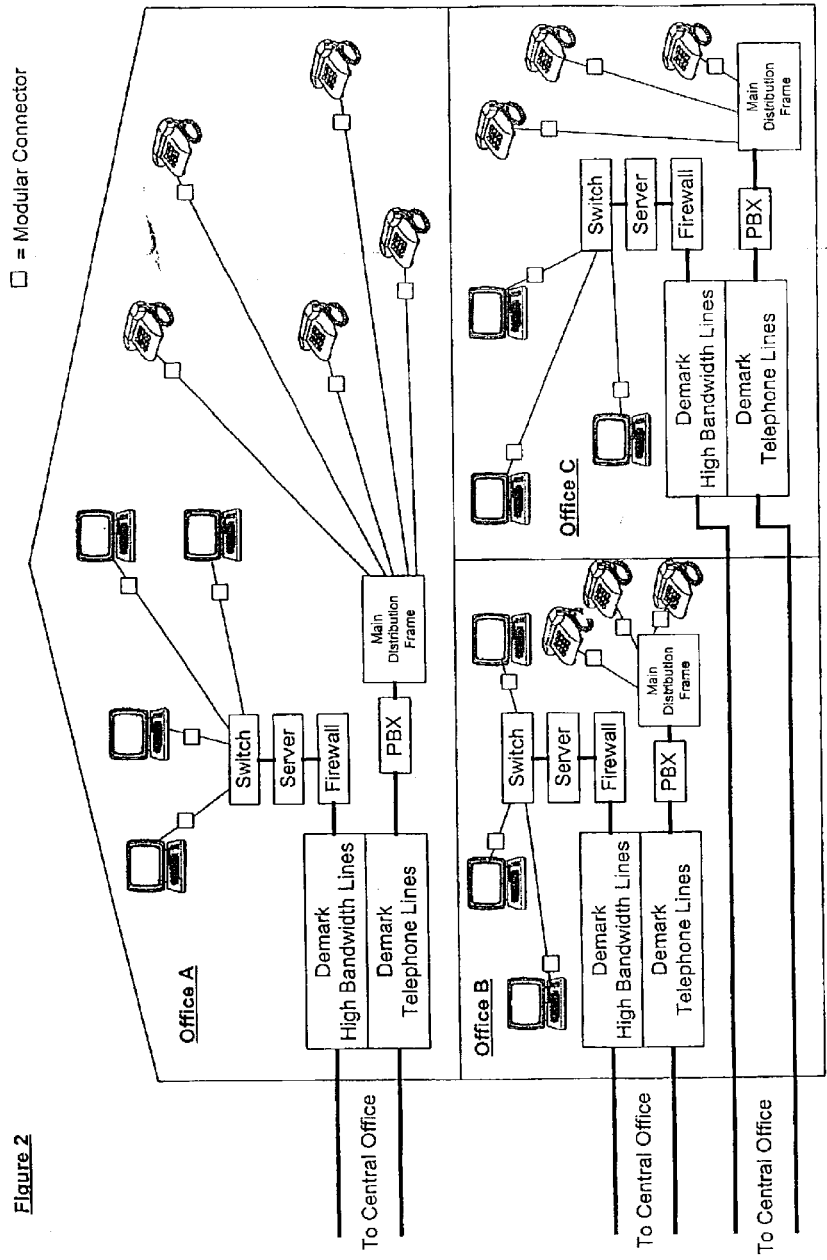
FIG. 2 is a block diagram illustrating cable runs in various locations in which the present invention can be used.

FIG. 2 illustrated a typical telecommunications wiring diagram for a multi-office building. Each of the cables to the various computers and telephones can be traced by the installer, for example, by attaching Modular Connector 17 illustrated in FIG. 1, to a corresponding modular jack attached to the wire which the installer desires to trace. These modular connectors are illustrated in FIG. 2 by small square boxes.

It should be obvious from the above-discussed apparatus embodiment that numerous other variations and modifications of the apparatus of this invention are possible, and such will readily occur to those skilled in the art. Accordingly, the scope of this invention is not to be limited to the embodiment disclosed, but is to include any such embodiments as may be encompassed within the scope of the claims appended hereto.

I claim:

1. A device for tracing electrical cable, said device comprising:

a recording device adapted for recording the physical location of a first end of a cable;

an interface device for electrically connecting said recording device to said first end of said cable;

wherein said device further includes a microphone coupled to a storage device for recording said physical location of said first end of said cable;

wherein said recording device is adapted to inject an audio electrical signal into said cable through said interface device, said audio electrical signal corresponding to said recording of the physical location of said first end of said cable and said audio signal being detectable along the length of said cable.

2. The device of claim 1, wherein said device further includes at least one clip lead for attaching said interface device to said first end of said cable.

3. The device of claim 2, wherein said interface device further includes a protection circuit for protecting said from device harmful voltages from said cable.

4. The device of claim 3, wherein said device further includes control switches for controlling the operation of said device.

5. The device of claim 4, wherein said device further includes a display for displaying the operational status of said device to said user.

6. The device of claim 5, wherein said display further includes a plurality of display lights.

7. The device of claim 6, wherein said device further includes a microprocessor unit for controlling the operation of said device.

8. The device of claim 7, wherein said device further includes an electronic memory coupled to said microprocessor for storing a computer control program for execution by said microprocessor.

9. The device of claim 8, wherein said device further includes a speaker for reproducing audio signals recorded by said device.

10. The device of claim 7, wherein said device further includes a digital-to-analogue and an analogue-to-digital converter for converting electrical signals from one form to another.

* * * * *